(12) United States Patent
Yoda

(10) Patent No.: US 10,935,824 B2
(45) Date of Patent: Mar. 2, 2021

(54) LIQUID CRYSTAL DISPLAY DEVICE HAVING A TEMPERATURE SENSOR

(71) Applicant: SHARP KABUSHIKI KAISHA, Sakai (JP)

(72) Inventor: Kazuhiko Yoda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 37 days.

(21) Appl. No.: 16/393,647

(22) Filed: Apr. 24, 2019

(65) Prior Publication Data

US 2019/0331950 A1    Oct. 31, 2019

(30) Foreign Application Priority Data

Apr. 26, 2018    (JP) .............................. JP2018-084959

(51) Int. Cl.
*G02F 1/133* (2006.01)
*G02F 1/13357* (2006.01)
*G01K 1/024* (2021.01)
*H03K 7/08* (2006.01)
*G09G 3/34* (2006.01)

(52) U.S. Cl.
CPC ......... *G02F 1/13306* (2013.01); *G01K 1/024* (2013.01); *G02F 1/133603* (2013.01); *G09G 3/3406* (2013.01); *H03K 7/08* (2013.01)

(58) Field of Classification Search
CPC .. G09G 2320/064; G09G 3/3406; G09G 3/34; H05B 33/0812; H05B 33/0815; H05B 33/0827

See application file for complete search history.

(56) References Cited

U.S. PATENT DOCUMENTS

| | | | | |
|---|---|---|---|---|
| 2007/0291198 A1* | 12/2007 | Shen | ................... | G09G 3/3413 349/69 |
| 2010/0156777 A1* | 6/2010 | Kang | ................... | G09G 3/342 345/102 |

FOREIGN PATENT DOCUMENTS

| | | | | |
|---|---|---|---|---|
| CN | 105741716 A | * | 7/2016 | ............... G09G 3/00 |
| CN | 105741716 A | | 7/2016 | |
| JP | 2000-292775 A | | 10/2000 | |
| JP | 2006-011086 A | | 1/2006 | |
| JP | 2006-154016 A | | 6/2006 | |
| JP | 2007-148444 A | | 6/2007 | |
| JP | 2011-197510 A | | 10/2011 | |
| JP | 2015-013560 A | | 1/2015 | |
| JP | 2016-078496 A | | 5/2016 | |

(Continued)

*Primary Examiner* — Yuzhen Shen
(74) *Attorney, Agent, or Firm* — ScienBiziP, P.C.

(57) ABSTRACT

A liquid crystal display device includes: a liquid crystal panel; light sources provided on a rear surface of the liquid crystal panel; a temperature sensor configured to detect an in-device temperature and provided on a rear surface side of the liquid crystal panel; and a control circuit configured to control lighting of the light sources by adjusting a duty ratio of a driving signal by pulse width modulation on the basis of the in-device temperature detected by the temperature sensor. When the in-device temperature is within a predetermined temperature range, the control circuit updates a current duty ratio of the driving signal in such a manner that the difference between the current duty ratio for each unit time and a target duty ratio preset for the in-device temperature is reduced in a stepwise manner.

6 Claims, 6 Drawing Sheets

(56) References Cited

FOREIGN PATENT DOCUMENTS

| JP | 2016-080757 A | 5/2016 |
|---|---|---|
| WO | 2013/099165 A1 | 7/2013 |

\* cited by examiner

LIQUID CRYSTAL DISPLAY DEVICE HAVING A TEMPERATURE SENSOR

BACKGROUND OF THE INVENTION

1. Field of the Invention

The present invention relates to a liquid crystal display device.

2. Description of Related Art

Conventionally, a technique for adjusting the luminance of a liquid crystal display attained by a backlight through pulse width modulation control has been known. Japanese patent publication No. 2016-80757 (hereinafter referred to as JP 2016-80757 A) discloses a liquid crystal display device configured to control the luminance of a liquid crystal display through pulse width modulation control.

The liquid crystal display device disclosed in JP 2016-80757 A adjusts the brightness of a liquid crystal display provided in a vehicle on the basis of the brightness level of a display screen instructed by an operation of a user and the ambient temperature in the vicinity of a backlight. Specifically, in this liquid crystal display device, for each of 11 brightness levels, the duty ratio of a pulse width modulation (PWM) signal for controlling the backlight is set in accordance with temperature. The duty ratio of the PWM signal is set such that, at every brightness level, it becomes smaller when the temperature is at or higher than a certain temperature.

The liquid crystal display device disclosed in JP 2016-80757 A is configured such that, when the temperature in the vicinity of the backlight reaches a certain temperature, the current duty ratio of the PWM signal is made smaller so as to be the duty ratio preset in accordance with the temperature. Although this configuration can prevent phase transition of liquid crystals in a high temperature environment, the brightness of a liquid crystal display surface drops suddenly, and this may bring discomfort to a user.

With the foregoing in mind, it is an object of the present invention to provide a liquid crystal display device that can prevent change in liquid crystal properties due to temperature change without causing a sudden change in the brightness of a display screen.

SUMMARY OF THE INVENTION

A liquid crystal display device according to one embodiment of the present invention is a liquid crystal display device including: a liquid crystal panel; a plurality of light sources provided on a rear surface of the liquid crystal panel; a temperature sensor configured to detect a temperature in the liquid crystal display device and provided on a rear surface side of the liquid crystal panel; and a control circuit configured to control, on the basis of the temperature detected by the temperature sensor, lighting of the plurality of light sources by adjusting a duty ratio of a driving signal obtained by pulse width modulation, wherein, when the temperature detected by the temperature sensor is within a predetermined temperature range, the control circuit updates the duty ratio of the driving signal in such a manner that a difference between a duty ratio of the driving signal for each unit time and a target duty ratio of the driving signal preset for the detected temperature is reduced in a stepwise manner.

According to the above configuration, change in liquid crystal properties due to temperature change can be prevented without causing a sudden change in the brightness of a display screen.

DETAILED DESCRIPTION OF THE INVENTION

Figure 1:
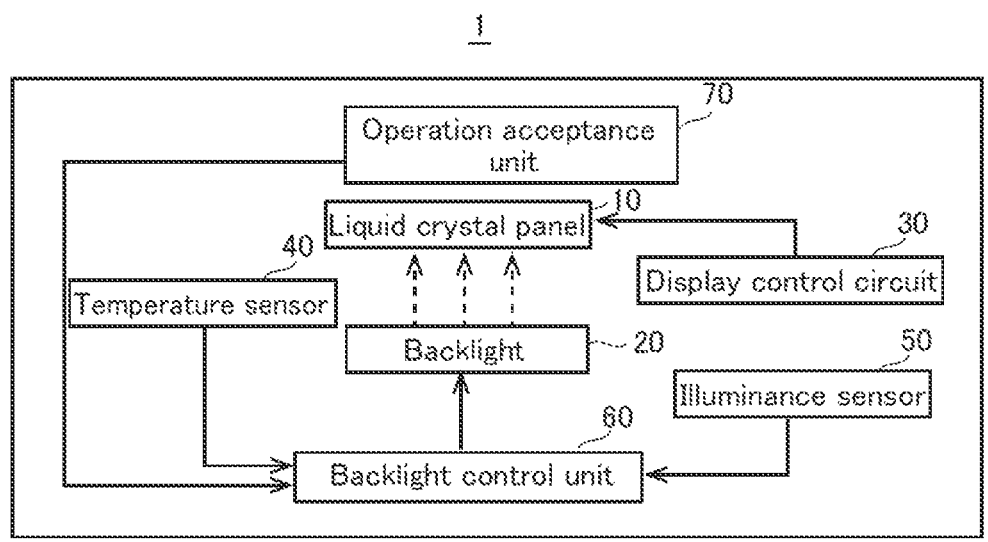
FIG. 1 is a block diagram showing a schematic configuration of a liquid crystal display device according to a first embodiment.

The liquid crystal display device according to one embodiment of the present invention is a liquid crystal display device including: a liquid crystal panel; a plurality of light sources provided on a rear surface of the liquid crystal panel; a temperature sensor configured to detect a temperature in the liquid crystal display device and provided on a rear surface side of the liquid crystal panel; and a control circuit configured to control, on the basis of the temperature detected by the temperature sensor, lighting of the plurality of light sources by adjusting a duty ratio of a driving signal obtained by pulse width modulation, wherein, when the temperature detected by the temperature sensor is within a predetermined temperature range, the control circuit updates the duty ratio of the driving signal in such a manner that a difference between a duty ratio of the driving signal for each unit time and a target duty ratio of the driving signal preset for the detected temperature is reduced in a stepwise manner (first configuration).

According to the first configuration, the temperature in the liquid crystal display device is detected by the temperature sensor provided on the rear surface side of the liquid crystal panel, and the control circuit controls, on the basis of the detected temperature, lighting of the plurality of light sources provided on the rear surface of the liquid crystal panel. The control circuit controls the lighting of the plurality of light sources by adjusting the duty ratio of the driving signal obtained by pulse width modulation. Specifically, when the temperature detected by the temperature sensor is within a predetermined temperature range, the control circuit updates the duty ratio of the driving signal in such a manner that the difference between the duty ratio of the driving signal for each unit time and the target duty ratio corresponding to the detected temperature is reduced in a stepwise manner. That is, the duty ratio is updated in such a manner that the duty ratio of the driving signal for each unit time approaches the target duty ratio corresponding to the detected temperature in a stepwise manner. Consequently, for example, in the case where the light sources are turned on with a duty ratio of 100%, even if the target duty ratio corresponding to the temperature in the liquid crystal display device at that timing is 10%, the duty ratio is updated so as to approach the target duty ratio in a stepwise manner, instead of being suddenly changed from 100% to 10%. As a result, it is possible to protect a liquid crystal material while avoiding sharp drop of the brightness of a display surface due to the update of the duty ratio.

In the first configuration, the control circuit may update the duty ratio of the driving signal in such a manner that the difference between the duty ratio of the driving signal for each unit time in a plurality of unit times and the target duty ratio is reduced in a regular manner (second configuration).

According to the second configuration, the duty ratio of the driving signal can be changed in a regular manner over the plurality of unit times so as to approach the target duty ratio. Thus, it is possible to control the lighting of the light sources without causing a sudden change in the brightness of the display surface.

In the second configuration, the updated duty ratio of the driving signal may change linearly over the plurality of unit times (third configuration).

According to the third configuration, the duty ratio of the driving signal can be changed at a constant rate over the plurality of unit times so as to approach the target duty ratio. Thus, the brightness of the display surface does not change suddenly.

In the second configuration, the updated duty ratio of the driving signal may change exponentially over the plurality of unit times (fourth configuration).

According to the fourth configuration, the duty ratio of the driving signal can be changed exponentially over the plurality of unit times so as to approach the target duty ratio. Thus, the brightness of the display surface does not change suddenly.

In any of the first to fourth configurations, the control circuit may calculate the updated duty ratio of the driving signal using the following expression 1, where Dc is the duty ratio of the driving signal for each unit time, Dt is the target duty ratio, and D is the updated duty ratio of the driving signal (fifth configuration).

$$D = K \times (Dt - Dc) + Dc \text{ (}K\text{: a constant satisfying } 0 < K < 1\text{)} \quad \text{Expression 1}$$

According to the fifth configuration, the duty ratio can be changed by a value corresponding to K times the difference between the target duty ratio and the duty ratio for each unit time.

In the fifth configuration, when the duty ratio of the driving signal for each unit time is smaller than the target duty ratio, the control circuit may calculate the updated duty ratio of the driving signal using the following expression 2 (sixth configuration).

$$D = K1 \times (Dt - Dc) + Dc \text{ (}K1\text{ is a constant satisfying } 0 < K1 < 1 \text{ and } K1 < K\text{)} \quad \text{Expression 2}$$

According to the sixth configuration, the duty ratio increases by a value corresponding to K1 times the difference between the target duty ratio and the duty ratio for each unit time. That is, the increase rate of the duty ratio is lower than that of the duty ratio calculated in the fifth configuration. Thus, in the case where the luminance of the display screen is set higher in accordance with the temperature in the liquid crystal display device, the luminance of the light sources does not rise suddenly and the temperature change in the liquid crystal display device can be gentle.

Embodiments of the present invention will be described in detail below with reference to the drawings. Components that are identical or equivalent to each other in the drawings are given the same reference numerals, and descriptions thereof are not repeated. For clarity of illustration, in the drawings to be referred to in the following description, configurations may be shown in simplified or schematic forms, and some components may be omitted. The dimensional ratios between the components shown in the respective drawings do not necessarily represent actual dimensional ratios.

First Embodiment

FIG. 1 is a block diagram showing a schematic configuration of a liquid crystal display device according to the present embodiment. The liquid crystal display device according to the present embodiment can be used as an on-vehicle display device for use in automobiles and the like, for example.

As shown in FIG. 1, a liquid crystal display device 1 includes a liquid crystal panel 10, a backlight 20, a display control circuit 30, a temperature sensor 40, an illuminance sensor 50, a backlight control unit 60, and an operation acceptance unit 70. The configurations of the respective components will be described specifically below.

Figure 2:
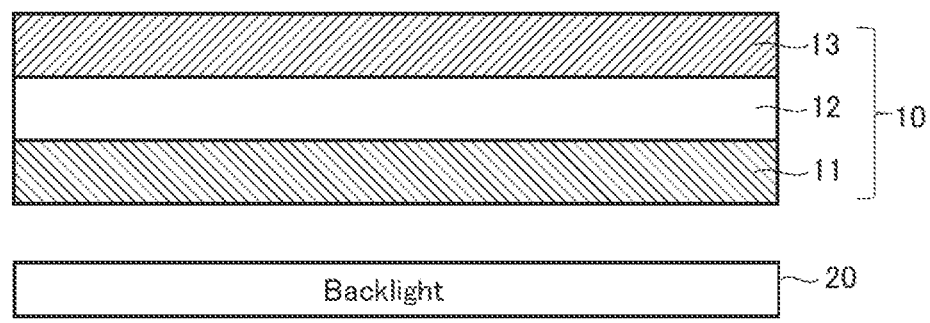
FIG. 2 is a schematic sectional view showing a liquid crystal panel and a backlight extracted from FIG. 1.
Figure 2:
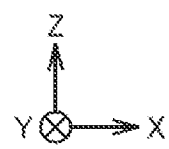

FIG. 2 is a schematic sectional view showing the liquid crystal panel 10 and the backlight extracted from FIG. 1. As shown in FIG. 2, the liquid crystal panel 10 includes an active matrix substrate 11, a liquid crystal layer 12, and a counter substrate 13.

The backlight 20 is provided on the rear surface side of the liquid crystal panel 10, i.e., on the side opposite to the liquid crystal layer 12 side of the active matrix substrate 11. Although not shown in FIG. 2, on the rear surface side of the active matrix substrate 11, the temperature sensor 40 shown in FIG. 1 is disposed in the vicinity of the backlight 20.

The active matrix substrate 11 and the counter substrate 13 are each provided with a glass substrate that is substantially transparent (having high light transparency). Although not shown in FIG. 2, a pair of polarizing plates is disposed with the active matrix substrate 11 and the counter substrate 13 being interposed therebetween.

The counter substrate 13 includes color filters (not shown) of three colors, namely, red (R), green (G), and blue (B), and a counter electrode to be described below.

Figure 3:
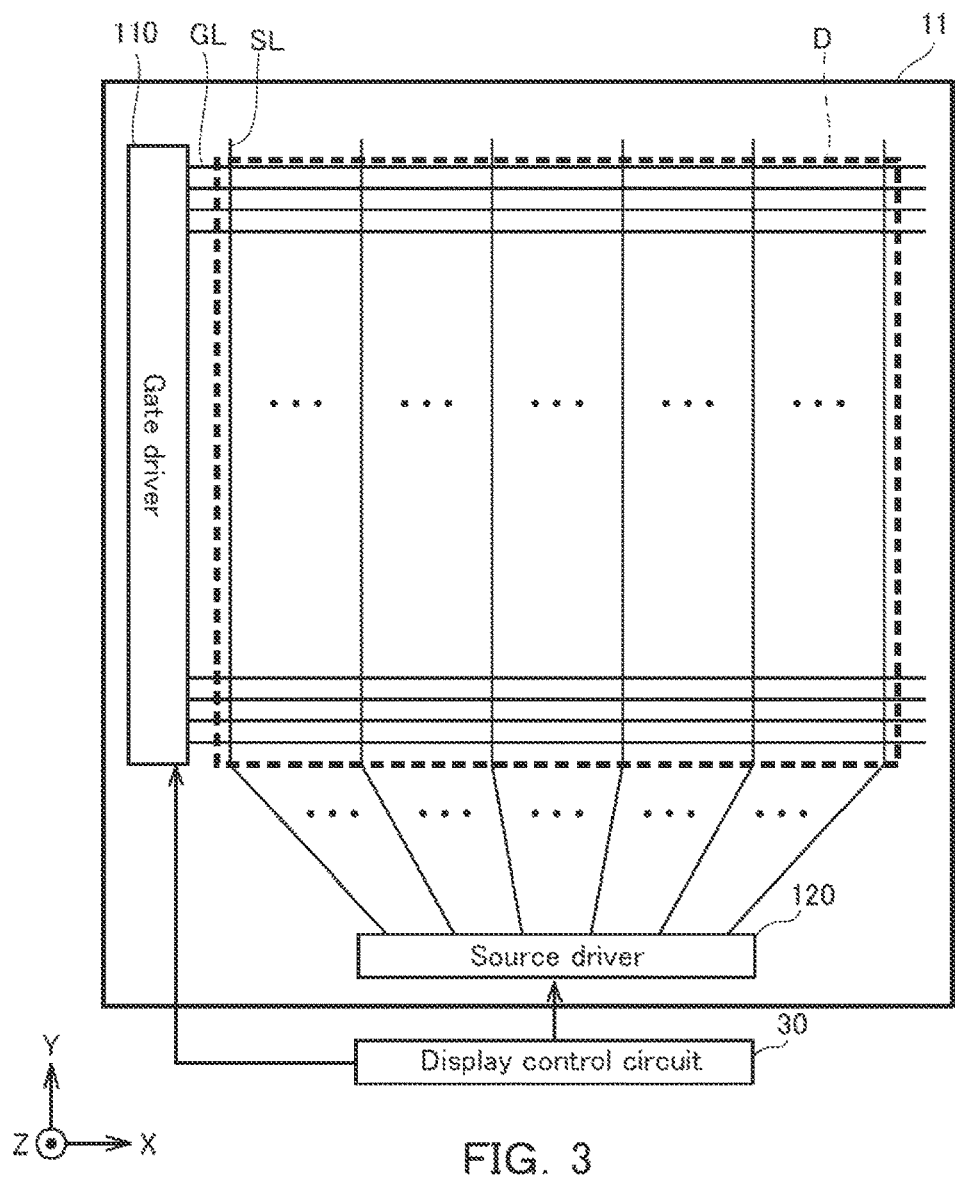
FIG. 3 is a plan view showing a schematic configuration of an active matrix substrate shown in FIG. 2.

FIG. 3 is a plan view showing a schematic configuration of the active matrix substrate 11. As shown in FIG. 3, the active matrix substrate 11 includes a plurality of gate lines GL, a plurality of source lines SL, a gate driver 110, and a source driver 120. The active matrix substrate 2 is connected to the display control circuit 30 via a flexible printed circuit (FPC) (not shown), for example.

Although not shown in FIG. 3, the active matrix substrate 11 includes a plurality of pixels, each of which is a region defined by the gate lines GL and the source lines SL and provided with a pixel electrode, and a display region D constituted by all the pixels. These pixels correspond to any of the colors R, G, and B of the color filters (not shown) provided on the counter substrate 13.

Figure 4:
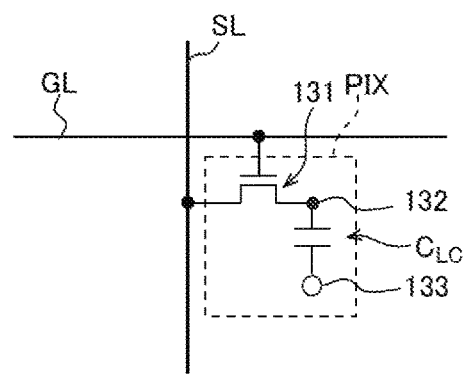
FIG. 4 shows an equivalent circuit of one pixel on the active matrix substrate shown in FIG. 3.

An equivalent circuit of one pixel is shown in FIG. 4. A pixel PIX includes a pixel switching element 131 composed of, e.g., a thin film transistor, a pixel electrode 132, and a counter electrode 133 provided on the counter substrate 13.

A gate electrode of the pixel switching element 131 is connected to the gate line GL, a source electrode of the pixel switching element 131 is connected to the source line SL, and a drain electrode of the pixel switching element 131 is connected to the pixel electrode 132. A liquid crystal capacitance $C_{LC}$ is formed between the pixel electrode 132 and the counter electrode 133.

Referring back to FIG. 3, it can be seen that the gate driver 110 and the source driver 120 are provided outside the display region D and are connected to the display control circuit 30. The gate driver 110 and the source driver 120 are driven on the basis of control signals supplied from the display control circuit 30.

The gate driver 110 has shift registers (not shown) provided for the respective gate lines GL. The shift registers for the respective gate lines GL switch the gate lines GL to a selected state sequentially on the basis of the control signals, such as gate start pulses and clock signals, supplied from the display control circuit 30, thereby scanning the gate lines GL.

The source driver 120 applies gradation voltages of an image to be written to the respective pixels to the respective source lines SL on the basis of the control signals, such as data writing timing signals and data signals, supplied from the display control circuit 30.

Figure 5A:
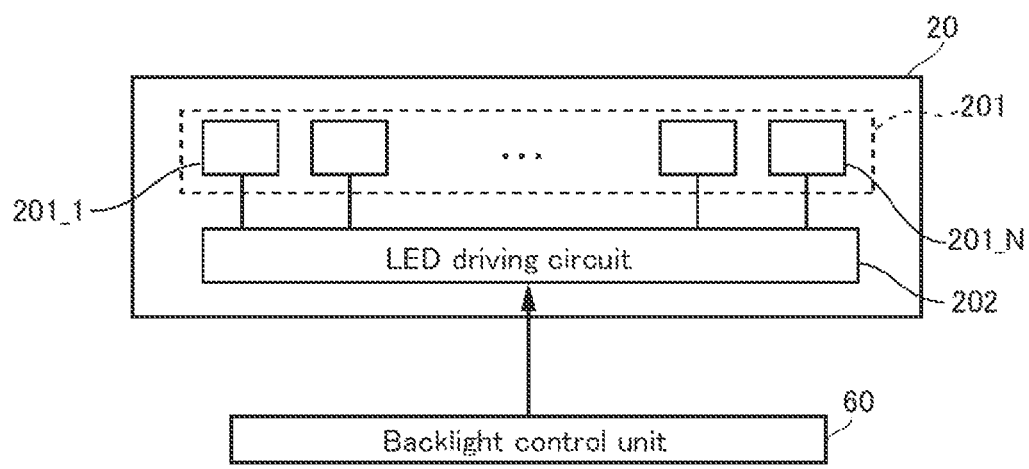
FIG. 5A is a block diagram showing schematic configurations of the backlight and a backlight control unit shown in FIG. 1.

Next, the configurations of the backlight 20 and the backlight control unit 60 will be described. FIG. 5A is a block diagram showing the backlight 20 and the backlight control unit 60 extracted from FIG. 1. As shown in FIG. 5A, the backlight 20 includes N LED strings 201 (201_1 to 201_N) and an LED driving circuit 202 connected to the respective LED strings 201.

In one LED string 201, a plurality of white LEDs are connected to each other in series. The N LED strings 201_1 to 201_N are connected to each other in parallel.

The LED driving circuit 202 is connected to the backlight control unit 60. The LED driving circuit 202 controls the lighting of the respective LED strings 201 on the basis of a PWM signal from the backlight control unit 60.

In this example, the LED driving circuit 202 drives the LED strings 201 by a static driving method in which a constant current based on the PWM signal is outputted.

Specifically, in the LED driving circuit 202, limiting resistors (not shown) are connected to the respective LED strings 201, and a constant current driving circuit is connected to the respective limiting resistors. The LED driving circuit 202 applies a voltage with a predetermined amplitude to the constant current driving circuit on the basis of the resistance values of the limiting resistors and the PWM signal supplied from the backlight control unit 60. The constant current driving circuit outputs to the LED strings 201 a constant current based on the applied voltage.

Figure 5B:
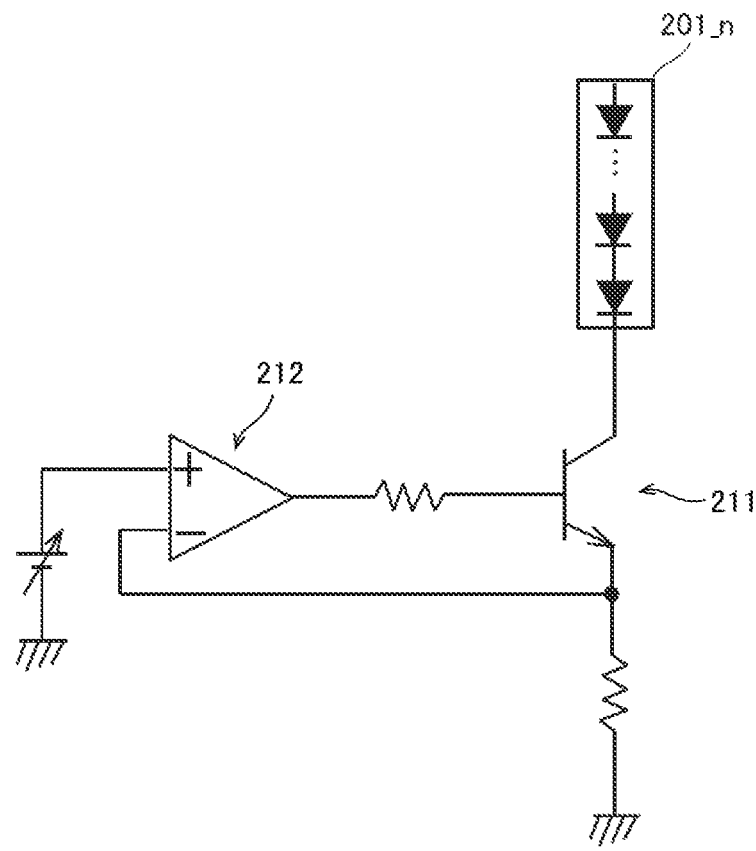
FIG. 5B is an equivalent circuit diagram showing an example of the configuration of a constant current driving circuit of an LED driving circuit shown in FIG. 5A.

The constant current driving circuit can be constituted by a well-known circuit. FIG. 5B is an equivalent circuit diagram showing an example of the configuration of the constant current driving circuit. As shown in FIG. 5B, the constant current driving circuit can be constituted using an NPN transistor 211 and an operational amplifier 212. A collector of the NPN transistor 211 is connected to the LED strings 201, an emitter of the NPN transistor 211 is connected to an inverting input element (−) of the operational amplifier 212, and a base of the NPN transistor 211 is connected to an output terminal of the operational amplifier 212. To a non-inverting input element (+) of the operational amplifier 212, a voltage that has been set on the basis of the PWM signal is applied.

Referring back to FIG. 1, the temperature sensor 40 is constituted by a thermistor circuit, for example. As described above, the temperature sensor 40 detects the temperature in the vicinity of the backlight 20 on the rear surface side of the active matrix substrate 11 at regular time intervals (e.g., 50 ms), and outputs a signal that indicates the detection result to the backlight control unit 60. The detection result outputted to the backlight control unit 60 by the temperature sensor 40 may be a moving average of the temperatures detected at intervals of 50 ms, for example.

The illuminance sensor 50 is provided on a front surface side of the liquid crystal panel 10. The illuminance sensor 50 detects an ambient brightness, and outputs a signal that indicates the detection result to the backlight control unit 60.

The operation acceptance unit 70 accepts operations from a user. In the present embodiment, the operation acceptance unit 70 is constituted by, for example, a touch panel provided on the liquid crystal panel 10, and may include manual operation buttons and the like. The operation acceptance unit 70 accepts an operation of setting the luminance of the display screen of the liquid crystal panel 10, and outputs a signal that indicates the set luminance to the backlight control unit 60.

The backlight control unit 60 is constituted by, for example, a control circuit such as a microcomputer having a computer processing unit (CPU), memory (including read only memory [ROM] and random access memory [RAM]), and a timer (they are all not shown). The backlight control unit 60 is connected to the temperature sensor 40, the illuminance sensor 50, and the operation acceptance unit 70 (see FIG. 1). The backlight control unit 60 adjusts the duty ratio of the PWM signal supplied to the LED driving circuit 202 in accordance with the temperature detected by the temperature sensor 40 every time the time measured with the timer (not shown) exceeds a predetermined unit time (e.g., 10 seconds). That is, the backlight control unit 60 controls the lighting, i.e., the luminance, of the respective LED strings 201 in the backlight 20 by adjusting the duty ratio of the PWM signal.

Also, the backlight control unit 60 adjusts the duty ratio of the PWM signal supplied to the LED driving circuit 202 on the basis of the luminance instructed by the operation acceptance unit 70 and the brightness level detected by the illuminance sensor 50. In this case, for example, luminances that can be specified by a user and duty ratios preset in accordance with ambient brightness levels may be stored in the backlight control unit 60. Alternatively, the backlight control unit 60 may calculate the duty ratio corresponding to the specified luminance and the brightness level detected by the illuminance sensor 50 using a predetermined arithmetic expression.

When the temperature detected by the temperature sensor 40 is equal to or higher than a predetermined temperature, the backlight control unit 60 performs duty ratio adjustment in accordance with the temperature, rather than in accordance with the luminance instructed by the operation acceptance unit 70 and the brightness detected by the illuminance sensor 50. The duty ratio adjustment in accordance with the temperature will be described specifically below.

Figure 6:
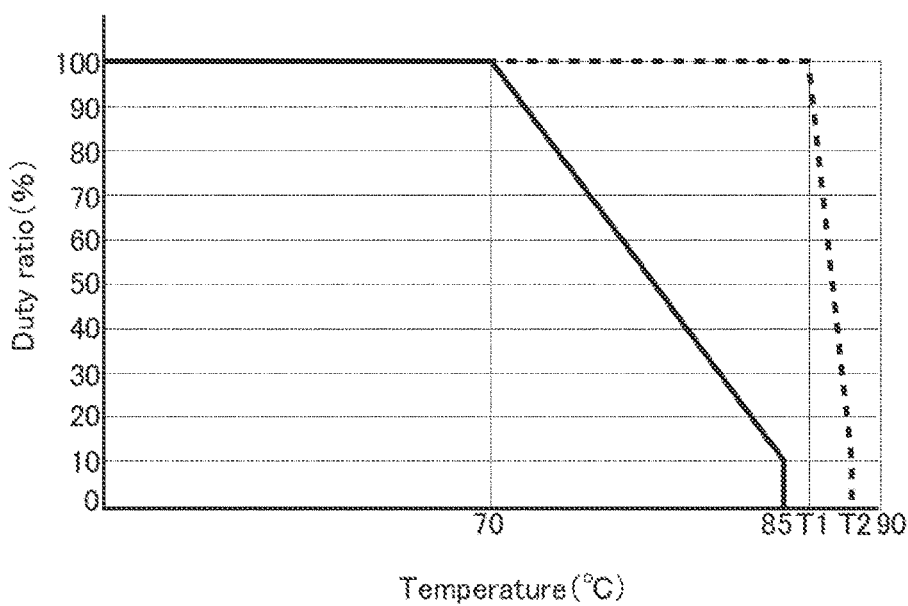
FIG. 6 shows the relationship between the duty ratio of a PWM signal and the temperature in the first embodiment.

FIG. 6 illustrates the relationship between the duty ratio of a PWM signal and the temperature in the present embodiment. In FIG. 6, the solid line indicates the change in the duty ratio of the PWM signal preset for environmental temperature around the liquid crystal display device 1. In FIG. 6, the dashed line indicates the change in the duty ratio of the PWM signal preset for the temperature detected by the temperature sensor 40 (referred to as "in-device temperature" hereinafter).

When the environmental temperature is 70° C. or lower, the duty ratio of the PWM signal is set to 100%, and the LED strings 201 are turned on at a predetermined luminance (referred to as "first luminance" hereinafter). When the environmental temperature is not lower than 70° C. and lower than 87° C., the duty ratio of the PWM signal is changed within the range from 100% to 10% to shorten the lighting time of the LED strings 201, whereby the LED strings 201 are turned on at a luminance (second luminance) lower than the first luminance. Then, when the environmental temperature is 85° C. or higher, the duty ratio of the PWM signal is set to 0%, whereby the LED strings 201 are turned off.

As described above, the temperature sensor 40 is provided on the rear surface side of the liquid crystal panel 10 and in the vicinity of the backlight 20. The temperature on the rear surface side of the liquid crystal panel 10 tends to be higher than the environmental temperature around the liquid crystal display device 1, and a temperature difference of about 10° C. to about 20° C. is caused between the in-device temperature and the environmental temperature. Accordingly, when the duty ratio adjustment at the environmental temperature as indicated with the solid line is applied to the in-device temperature, the duty ratio adjustment as indicated with the dashed line is performed. That is, if the duty ratio is adjusted in accordance with the environmental temperature, a duty ratio of 100% is maintained until the in-device temperature reaches a temperature T1 higher than 70° C. (for example, the temperature T1 is 87° C.). A liquid crystal material turns to isotropic liquid by phase transition at a temperature of 90° C. or higher, and it becomes no longer possible to control the transmittance. On this account, at a temperature T2 (e.g., 89° C.) just below the onset of the phase transition of the liquid crystal material, the duty ratio needs to be reduced to 10% in order to lower the luminance of the LED strings 201.

As described above, in the present embodiment, the target duty ratio of the PWM signal is set to 100% when the in-device temperature is lower than T1 (e.g., 87° C.), and the duty ratio is changed in the range from 100% to 10% when the in-device temperature is a temperature between T1 and T2. In the backlight control unit 60, target duty ratios corresponding to in-device temperatures are stored in advance.

In the case where the in-device temperature has changed from T1 to T2, if the duty ratio is changed from 100% to 10%, the display surface suddenly becomes dark, which brings discomfort to a user. Thus, in the present embodiment, the duty ratio adjustment is performed in such a manner that the duty ratio of a PWM signal per unit time (referred to as "current duty ratio" hereinafter) approaches the target duty ratio corresponding to the in-device temperature in a stepwise manner. In other words, the duty ratio is adjusted for each unit time in such a manner that the difference between the duty ratio for each unit time and the target duty ratio is reduced in a stepwise manner. The method for adjusting the duty ratio will be described specifically below.

Figure 7:
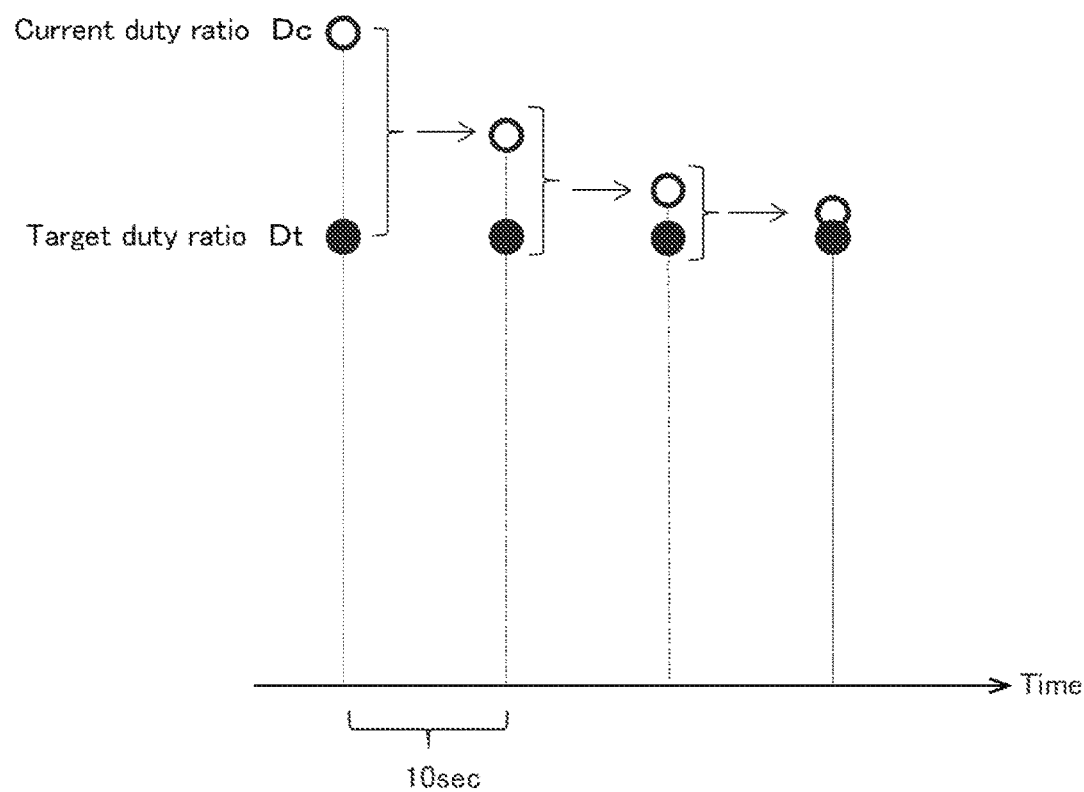
FIG. 7 is a conceptual diagram illustrating the change in a current duty ratio relative to a target duty ratio.

FIG. 7 is a conceptual diagram illustrating the change in a current duty ratio Dc and a target duty ratio Dt in certain unit times. In the example shown in FIG. 7, a black circle indicates the target duty ratio Dt, and a white circle indicates the current duty ratio Dc. As can be seen in FIG. 7, the current duty ratio Dc indicated with the white circle changes so as to approach the target duty ratio Dc in a stepwise manner as the unit time (e.g., 10 second) passes.

The duty ratio D in a subsequent unit time is calculated using the following expression (1).

$$D = K \times (Dt - Dc) + Dc \quad \text{Expression (1)}$$

Dc: Current duty ratio
Dt: Target duty ratio corresponding to in-device temperature In this example, K is set to ½, for example. However, the value of K is not limited thereto as long as it is a constant satisfying 0<K<1.

In this case, the calculated duty ratio D decreases or increases by a value corresponding to ½ times the difference between the target duty ratio Dt and the current duty ratio Dc, thereby gradually approaching the target duty ratio. That is, in the present embodiment, until a target duty ratio corresponding to the in-device temperature is achieved, the duty ratio adjustment is performed over a plurality of unit times in such a manner that the difference between the duty ratio for each unit time and the target duty ratio is reduced in a regular manner. Accordingly, for example, when the in-device temperature changes from T1 to T2, as compared with the case where a current duty ratio of 100% is changed to a target duty ratio of 10% in a single unit time, the display surface is prevented from suddenly becoming dark and discomfort to a user is less likely to be caused.

Figure 8:
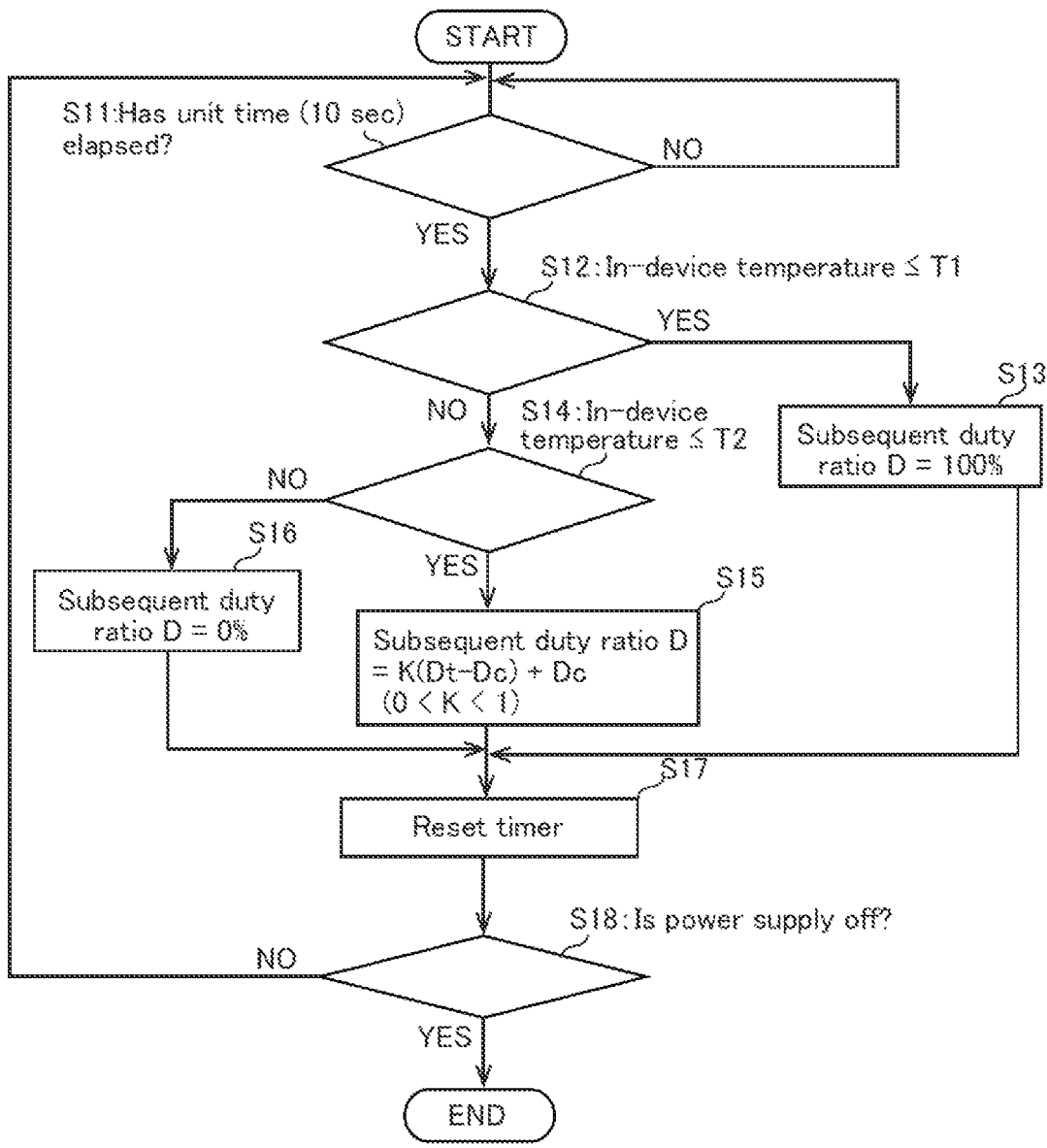
FIG. 8 is a flowchart illustrating an example of operations of a duty ratio adjustment process in the first embodiment.

Now, with reference to the flowchart of FIG. 8, an example of operations of a process for the above-described adjustment of the duty ratio of a PWM signal will be described.

The backlight control unit 60 adjusts the duty ratio for each unit time on the basis of the in-device temperature detected by the temperature sensor 40 every time the time measured with the timer (not shown) exceeds a unit time (e.g., 10 seconds) (Step S11: YES).

Specifically, when the in-device temperature is equal to or lower than T1 (e.g., 87° C.) (Step S12: YES), the backlight control unit 60 sets the duty ratio in a subsequent unit time to 100%, and outputs a PWM signal with a duty ratio of 100% to the LED driving circuit 202. As a result, the respective LED strings 201 are turned on with the cycle and the duty ratio of the PWM signal by the LED driving circuit 202.

When the in-device temperature is higher than T1 (e.g., 87° C.) and not higher than T2 (e.g., 89° C.) (Step S12: NO, Step S14: YES), the backlight control unit 60 calculates the duty ratio in the subsequent unit time using the above expression (1). Then, the backlight control unit 60 outputs the PWM signal with the calculated duty ratio to the LED driving circuit 202 (Step S15). As a result, the respective LED strings 201 are turned on with the cycle and the duty ratio of the PWM signal by the LED driving circuit 202.

On the other hand, when the in-device temperature is higher than T2 (e.g., 89° C.) (Step S14: NO), the backlight control unit 60 sets the duty ratio in the subsequent unit time to 0%, and outputs a PWM signal with a duty ratio of 0% to the LED driving circuit 202 (Step S16). As a result, the respective LED strings 201 are turned off.

The backlight control unit 60 resets the timer (not shown) (Step S17), and the process steps shown in Step S11 and the steps subsequent thereto are repeated until a power supply of the liquid crystal display device 1 is turned off (Step S18: NO). The backlight control unit 60 terminates the duty ratio adjustment process when the power supply of the liquid crystal display device 1 is turned off (Step S18: YES).

Second Embodiment

The above-described first embodiment mainly describes an example where, when the in-device temperature is high, the luminance of the display screen is lowered gradually by reducing the duty ratio of a PWM signal in a stepwise manner so as to achieve a target duty ratio corresponding to the in-device temperature. That is, the above-described first embodiment is mainly directed to an example where a target duty ratio is smaller than a current duty ratio.

The present embodiment will describe an example of duty ratio adjustment in the case where a target duty ratio is larger than a current duty ratio. As such an example, the following conditions are conceivable. For example, when the in-device temperature is equal to or higher than T2 and the LED strings 201 are off (in FIG. 8, Step S14: NO and Step S16), the in-device temperature may then be lower than T2. In this case, the backlight control unit 60 adjusts the duty ratio so as to be a target duty ratio corresponding to the in-device temperature and turns on the LED strings 201.

At this time, the backlight control unit 60 calculates the updated duty ratio using the following expression (2).

$$D=K1\times(Dt-Dc)+Dc \quad \text{Expression (2)}$$

In this example, K1 is set to K/2 (0<K<1).

The duty ratio calculated using the above expression (2) increases by a value corresponding to K/2 times the difference between the target duty ratio and the current duty ratio. That is, if the difference between the target duty ratio and the current duty ratio in the case where the luminance of the display screen is increased is the same as that in the case where the luminance of the display screen is decreased, the change rate in the case where the luminance is increased corresponds to ½ times the change rate in the case where the luminance is decreased. In other words, in the case where the luminance of the display screen is increased in accordance with the in-device temperature, the speed at which the current duty ratio reaches the target duty ratio is slower than that in the case where the luminance of the display screen is decreased. According to such a configuration, it is possible to prevent a sudden rise of the temperature on the rear surface side of the liquid crystal panel 10 as a result of turning on the LED strings 201.

The above description is directed to an example where K1 is K/2 in the expression (2). It is to be noted, however, that K1 is not limited as long as it satisfies at least K1<K.

Figure 9:
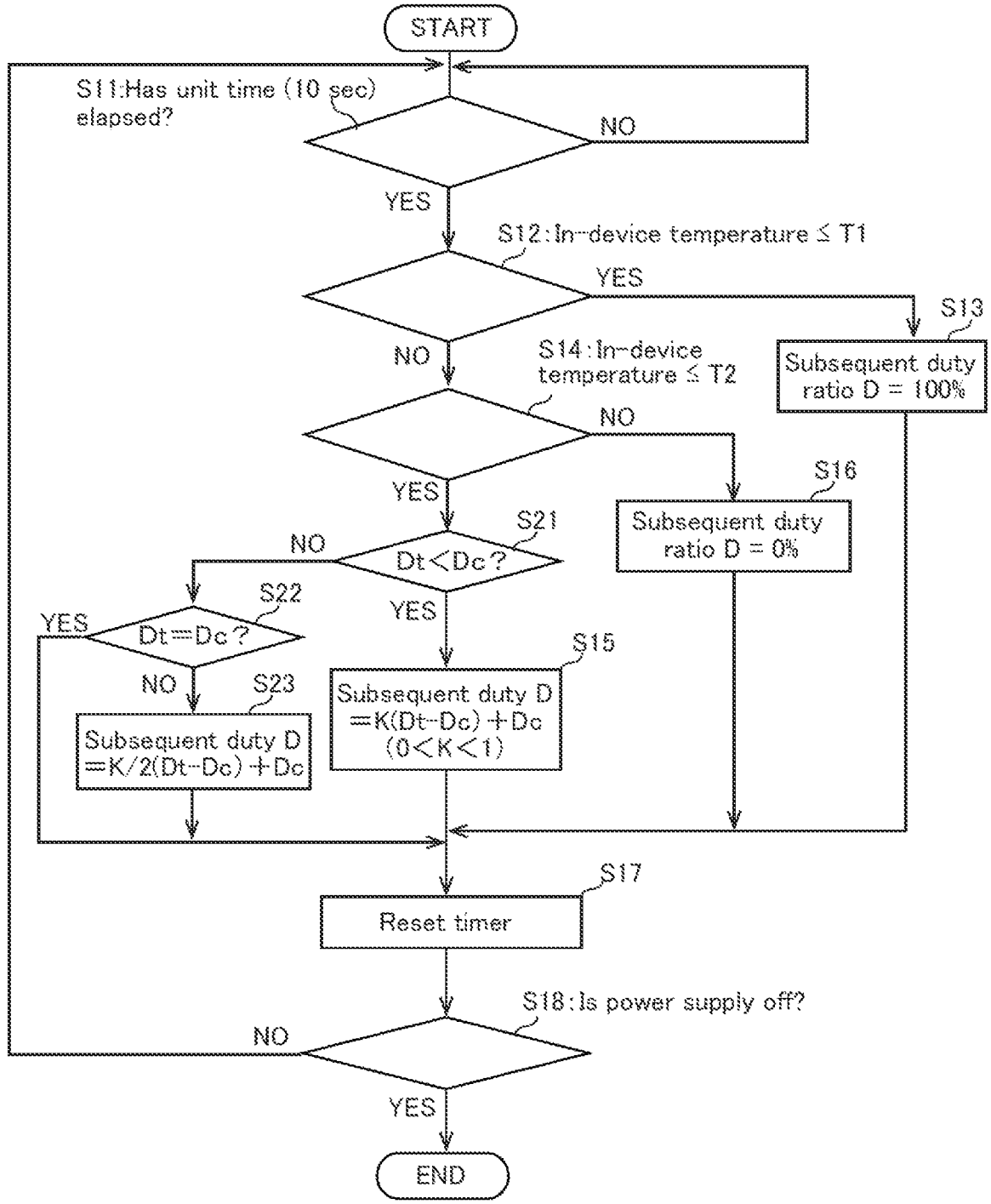
FIG. 9 is a flowchart illustrating an example of operations of a duty ratio adjustment process in a second embodiment.

FIG. 9 is a flowchart illustrating an example of operations of a process for the adjustment of the duty ratio of a PWM signal in the present embodiment. In FIG. 9, the same process steps as those in the first embodiment are given the same step numbers. In the following, the process steps that are different from those in the first embodiment will be mainly described.

In FIG. 9, when the process advances to YES in Step S14, i.e., when the in-device temperature is higher than T1 (e.g., 87° C.) and not higher than T2 (e.g., 89° C.), the backlight control unit 60 determines whether the target duty ratio Dt corresponding to the in-device temperature and the current duty ratio Dc satisfy Dt<Dc (Step S21).

In Step S21, when the target duty ratio Dt and the current duty ratio Dc satisfy Dt<Dc (Step S21: YES), the backlight control unit 60 calculates the duty ratio in a subsequent unit time using the expression (1) (Step S15).

On the other hand, in Step S21, when the target duty ratio Dt and the current duty ratio Dc do not satisfy either Dt<Dc or Dt=Dc (Step S21: NO and Step S22: NO), the backlight control unit 60 calculates the duty ratio in the subsequent unit time using the expression (2) (Step S23).

In Step S22, when the target duty ratio Dt is equal to the current duty ratio Dc (Step S22: YES), the backlight control unit 60 does not calculate the updated duty ratio, and the process advances to Step S17.

Although the liquid crystal display device according to the present invention has been described above by way of examples, the configuration of the liquid crystal display device according to the present invention is not limited to those described in the above-described embodiments and may be modified in various ways.

(1) In the above-described first and second embodiments, the calculated duty ratio changes exponentially by a value corresponding to K1 times or K times the difference between a target duty ratio and a current duty ratio. It is to be noted, however, that the calculated duty ratio may change at a constant rate over a plurality of unit times, for example. That is, the duty ratio may be changed linearly according to the difference between the target duty ratio and the current duty ratio.

In short, when the in-device temperature satisfies a predetermined temperature condition, the duty ratio for each unit time need only be updated in such a manner that it approaches to the target duty ratio corresponding to the in-device temperature in a stepwise manner over a plurality of unit times. Accordingly, the change in the updated duty ratio is not limited to the above-described regular change and may be irregular change.

(2) The above-described first and second embodiments are each directed to an example where the liquid crystal display device 1 is used as an on-vehicle display device for use in automobiles and the like. The temperature inside vehicles such as automobiles changes easily. Thus, the in-device temperature of the liquid crystal display device 1 changes accompanying the change in environmental temperature. Therefore, the liquid crystal display device 1 configured so as to adjust the lighting (luminance) of the LED strings 201 in accordance with the temperature is suitable as an on-vehicle display device. It is to be noted, however, that the liquid crystal display device 1 can be used suitably not only as an on-vehicle display device but also as any display device to be used in an environment subjected to temperature change, such as a display of a smartphone or the like.

What is claimed is:

1. A liquid crystal display device comprising:
   a liquid crystal panel;
   a plurality of light sources provided on a rear surface of the liquid crystal panel;
   a temperature sensor configured to detect a temperature in the liquid crystal display device, the temperature sensor being provided on a rear surface side of the liquid crystal panel; and
   a control circuit configured to control, on the basis of the temperature detected by the temperature sensor, lighting of the plurality of light sources by adjusting a duty ratio of a driving signal obtained by pulse width modulation,
   wherein, when the temperature detected by the temperature sensor is within a predetermined temperature range, the control circuit updates the duty ratio of the driving signal in such a manner that a difference between a duty ratio of the driving signal for each unit time and a target duty ratio of the driving signal preset for the detected temperature is reduced in a stepwise manner; and
   the control circuit calculates the updated duty ratio of the driving signal using the following expression 1, where Dc is the duty ratio of the driving signal for each unit time, Dt is the target duty ratio, and D is the updated duty ratio of the driving signal:

$$D = K \times (Dt - Dc) + Dc \quad (K \text{ is a constant satisfying } 0 < K < 1) \quad \text{(Expression 1)}.$$

2. The liquid crystal display device according to claim 1, wherein
the control circuit updates the duty ratio of the driving signal in such a manner that the difference between the duty ratio of the driving signal for each unit time in a plurality of unit times and the target duty ratio is reduced in a regular manner.

3. The liquid crystal display device according to claim 2, wherein
the updated duty ratio of the driving signal changes linearly over the plurality of unit times.

4. The liquid crystal display device according to claim 2, wherein
the updated duty ratio of the driving signal changes exponentially over the plurality of unit times.

5. The liquid crystal display device according to claim 1, wherein
when the duty ratio of the driving signal for each unit time is smaller than the target duty ratio, the control circuit calculates the updated duty ratio of the driving signal using the following expression 2:

$$D = K1 \times (Dt - Dc) + Dc \quad \text{(Expression 2)}$$

(K1 is a constant satisfying 0<K1<1 and K1<K).

6. The liquid crystal display device according to claim 1, wherein
the predetermined temperature range is at a first threshold temperature or more and at a second threshold temperature or less, the second threshold temperature being higher than the first threshold temperature, and
when the temperature detected by the temperature sensor exceeds the second threshold temperature, the control circuit turns off the plurality of light sources.

\* \* \* \* \*